US006774396B1

(12) United States Patent
Chang et al.

(10) Patent No.: US 6,774,396 B1
(45) Date of Patent: Aug. 10, 2004

(54) THIN FILM TRANSISTOR TYPE OPTICAL SENSOR

(75) Inventors: Youn Gyoung Chang, Kyunggi-do (KR); Jeong Hyun Kim, Kyunggi-do (KR); Se June Kim, Seoul (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/487,173

(22) Filed: Jan. 19, 2000

(30) Foreign Application Priority Data

Jan. 20, 1999 (KR) .......................................... 1999-1699

(51) Int. Cl.[7] .............................................. H01L 29/04
(52) U.S. Cl. .......................... 257/59; 257/72; 257/291; 257/292; 257/431; 250/208.1; 250/208.4; 382/124
(58) Field of Search .......................... 257/72, 291, 292, 257/431, 59; 250/208.1, 208.4; 382/124; 356/445; 324/76.79, 76.81

(56) References Cited

U.S. PATENT DOCUMENTS

| 3,850,508 | A | * | 11/1974 | Sittig et al. .................... 356/30 |
| 5,028,787 | A | * | 7/1991 | Rosenthal et al. ......... 250/339.12 |
| 5,162,644 | A | * | 11/1992 | Nagata et al. ............. 250/208.1 |
| 5,287,169 | A | * | 2/1994 | Pollak et al. ................ 250/226 |
| 5,313,941 | A | * | 5/1994 | Braig et al. .................... 356/41 |
| 5,325,442 | A | * | 6/1994 | Knapp ......................... 361/278 |
| 5,348,003 | A | * | 9/1994 | Caro ............................ 356/39 |
| 5,991,467 | A | * | 11/1999 | Kamiko ....................... 382/312 |
| 6,098,330 | A | * | 8/2000 | Schmitt et al. ............. 42/70.11 |
| 6,172,743 | B1 | * | 1/2001 | Kley et al. .................... 356/39 |
| 6,240,199 | B1 | * | 5/2001 | Manchanda et al. ........ 257/415 |

FOREIGN PATENT DOCUMENTS

| JP | 54130977 | * | 10/1979 | .................. 356/445 |
| JP | 60154230 | * | 8/1985 | .................. 356/445 |
| JP | 04095853 | * | 3/1992 | .................. 356/445 |
| JP | 63067503 A | * | 3/1998 | ............ G01B/7/00 |
| JP | 11120854 | * | 4/1999 | |

* cited by examiner

Primary Examiner—Jerome Jackson
Assistant Examiner—Eugene Lee
(74) Attorney, Agent, or Firm—McKenna Long & Aldridge LLP

(57) ABSTRACT

A image detector comprises a light source for radiating light in accordance with a predetermined signal; a window for transmitting the light from the light source; a thin film phototransistor for generating an optical current in accordance with the intensity of external light; a storage capacitor for storing charge information transmitted from the thin film phototransistor; a thin film switching transistor for outputting the information stored in the storage capacitor in accordance with an external control signal; an insulating layer for covering the window, the thin film phototransistor, the storage capacitor, and the thin film switching transistor, a protecting layer formed on the insulating layer; and a conductive object detection pattern formed on the protecting layer to apply an electrical power supply signal to the light source when a conductive living object contacts the conductive objecting detecting pattern.

17 Claims, 4 Drawing Sheets

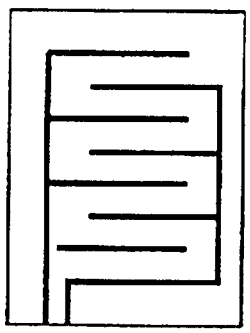
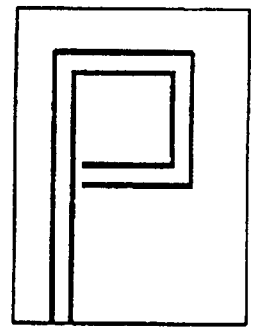
FIG. 5a    FIG. 5b
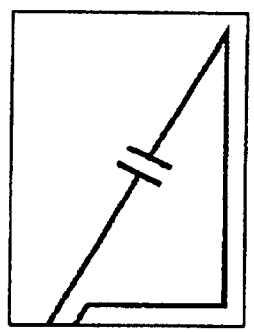
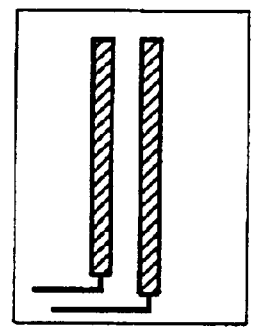
FIG. 5c    FIG. 5d

THIN FILM TRANSISTOR TYPE OPTICAL SENSOR

This application claims the benefit of Korean Patent Application No. 1999-01699, filed on Jan. 20, 1999, which is hereby incorporated by reference for all purposes as if fully set forth herein.

BACKGROUND OF THE INVENTION

1. Field of the Invention

The present invention relates to an image detector and, more particularly, to a thin film transistor (TFT) type optical sensor with a conductive object or living object detection pattern.

2. Discussion of the Related Art

Generally, a thin film transistor type optical sensor comprises a window for receiving light reflected from an object, a sensor TFT for generating an optical current in proportion to the intensity of the light, a storage capacitor for storing charges of the optical current transmitted from the sensor TFT as charged information, and a switching TFT for outputting the charged information stored in the storage capacitor in accordance with an external control signal.

FIG. 1 shows a conventional TFT type optical sensor.

A sensor S1 is coupled to a controller 2 whose output end is coupled to an input end of an electrical power source 4. An output end of the electrical source 4 is electrically coupled to both the sensing part 6 and a light source 8. The sensor S1 may be replaced with a mechanical switch or an infrared switch. In operation, when a signal is output from the sensor S1, the controller 2 transmits the signal to the sensing part 6 and the light source 8 through the electrical power source 4.

FIG. 2 shows another conventional TFT type optical sensor using a mechanical switch SW1 instead of the sensor S1.

One end of the switch SW1 is coupled to an input end of the electrical power source 4 and the other end to an input end of a controller 2. An output end of the controller 2 is coupled to an input end of the electrical power source 4 whose output end in turn is coupled to both a sensing part 6 and a light source 8.

In operation, when the switch SW1 is turned "ON" to operate the optical sensor, electrical power is supplied from the electrical power source 4 to the controller 2, then input to the electrical power source 4 as a predetermined control signal. Next, the electrical power source 4 transmits electrical power to the sensing part 6 and the light source 8.

The two above-described conventional TFT type optical sensors have the following drawbacks:

1. When the switch is turned ON, since electrical power is always supplied, electrical power is unnecessarily consumed even when the sensor is not detecting an object.

2. They have no means for recognizing whether an object is living or not. For example, the sensor may be a fingerprint detection device, In that case, it is important for the sensor to discriminate between a live human finger, and, for example, a photograph or photocopy of a human fingerprint. Otherwise, the fingerprint detection device may be spoofed.

SUMMARY OF THE INVENTION

Accordingly, the present invention is directed to an image detector that substantially obviates one or more of the problems due to limitations and disadvantages of the related art.

It is an objective of the present invention to provide a TFT type optical sensor that uses a minimal amount of electrical power and can recognize whether an object is living or not.

To achieve the above objective, in accordance with the purpose of the present invention, as embodied and broadly described, the present invention provides a TFT type optical sensor with a conductive object detection pattern, having a backlight and a sensing part to which electrical power is supplied only when the detection of an object is carried out. By detecting whether and to what degree the object is conductive, the a TFT type optical sensor can detect a living object.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings. It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIGS. 5a to 5f are plan views of various conductive object detection patterns provide to a TFT type optical sensor according to a preferred embodiment of the present invention.

DESCRIPTION OF THE PREFERRED EMBODIMENTS

Reference will now be made in detail to a preferred embodiment of the present invention, an example of which is illustrated in the accompanying drawings.

Figure 1:
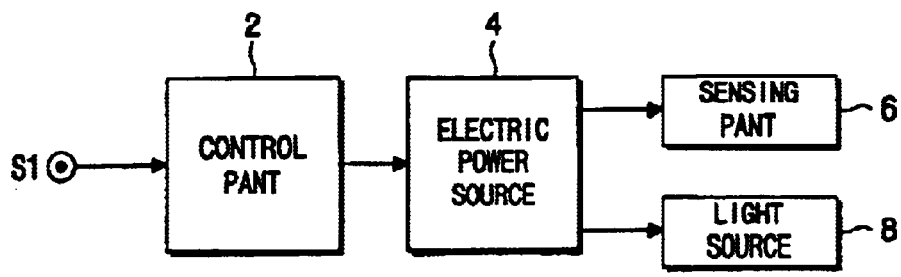
FIG. 1 is a block diagram of a conventional optical sensor.
Figure 2:
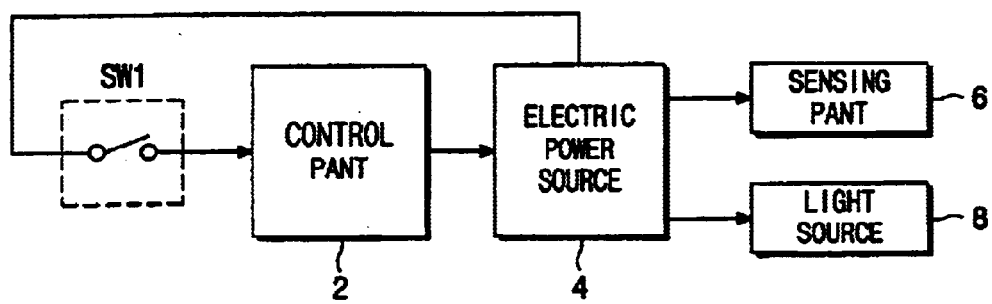
FIG. 2 is a block diagram of another conventional optical sensor.
Figure 3:
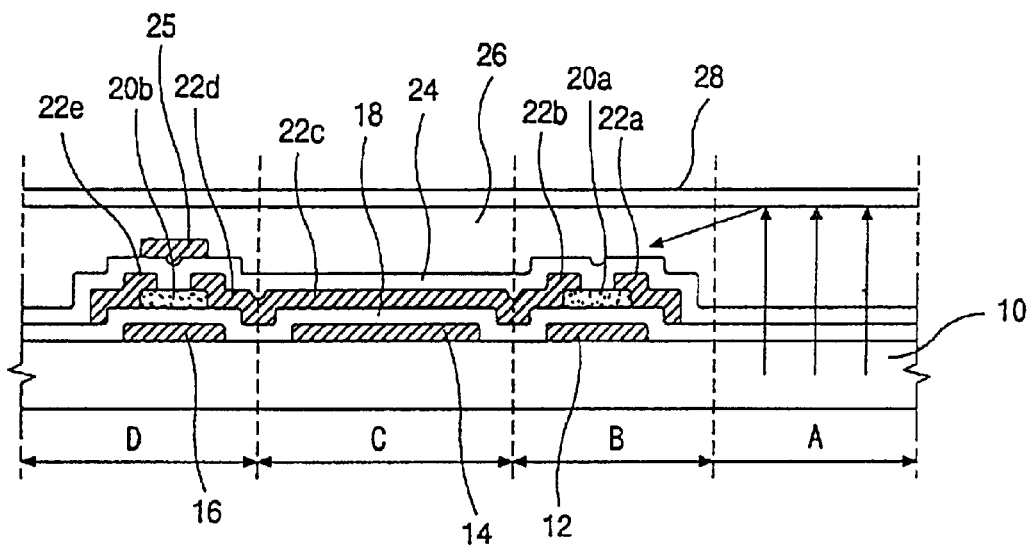
FIG. 3 is a sectional view of a TFT type optical sensor according to a preferred embodiment of the present invention.

FIG. 3 shows a sectional view of a TFT type optical sensor according to a preferred embodiment of the present invention.

A substrate 10 is divided into a window A, a sensor TFT area B, a storage area C, and a switching TFT area D. A conductive metal is deposited on the substrate 10, then patterned such that a sensor gate 12, a first storage electrode 14, and a switch gate 16 are respectively formed on the sensor TFT area B, the storage area C, and storage area C, and the switching TFT area D. An amorphous silicon is deposited on the substrate 10, and then patterned such that a sensor semiconductor layer 20a and a switch semiconductor layer 20b are formed on the first insulating layer 18 corresponding to sensor TFT area B and the switching TFT area D, respectively.

A conductive metal is further deposited on the first insulating layer 18, then patterned such that a sensor drain 22a and a sensor source 22b are formed covering an edge of the sensor semiconductor layer 20a and the switch semiconductor layer 20b. A second storage electrode 20c is formed on the first insulating layer 18 corresponding to the first storage electrode 14, and a switch drain 22d and a switch source 22e are formed on the first insulating layer 18 while covering an edge of the switch semiconductor layer 20b.

A second insulating layer 24 is deposited on the first insulating layer 18 while covering the semiconductor layers and the sensor drains and sources A light blocking layer 25 is formed on the second insulating layer 24 corresponding to the switching TFT area D, then a protecting layer 26 is formed on the second insulating layer 24 and covering the light blocking layer 25.

A conductive object detection pattern (which may be a living object detection pattern) 28 is formed on the protecting layer 26. The conductive object detection pattern 28 (or living object detection pattern) comprises first and second electrodes 28a and 28b that are spaced apart from each other. In a preferred embodiment, each of the first and second electrodes 28a and 28b are finger-shaped, fingers of the first and second electrodes 28a and 28b being alternately disposed. The controller 30 is coupled to the conductive object detection pattern 28 to supply an electrical signal to one of the first and second electrodes 28a and 28b and to receive a predetermined electrical signal from the other of the first and second electrodes 28a and 28b. The distance between the first and second electrodes 28a and 28b is narrower than a width of a human finger so that when a user presses the conductive object detection pattern 28, the first and second electrodes 28a and 28b can be electrically coupled to each other via a user's finger by virtue of the electrical conductivity of the human finger.

When the first and second electrodes 28a and 28b are electrically coupled to each other by the user's finger, the controller 30 receives the electrical signal from one of the electrodes 28a and 28b. The controller 30 then transmits an electrical control signal to the electrical power source 36, then the electrical power source 36 applies a predetermined voltage to the sensing part 32 and the light source 34. When the first and second electrodes 28a and 28b are electrically disconnected by the user removing his/her finger, the application of the voltage to the sensing part 32 and the light source 34 is discontinued. Preferably, the controller 30 may sense a current flowing between the first and second electrodes 28a and 28b to determine a conductivity between the first and second electrodes 28a and 28b to discriminate whether a living object is on the conductive object detection pattern 28. In one embodiment, the controller 30 may receive an electrical signal to be supplied to the conductive object detection pattern 28 from the electrical power source 36. Alternatively, the controller may produce the electrical signal to be supplied to the conductive object detection pattern 28.

Accordingly, since the TFT type optical sensor uses electrical power only when it is detecting the object, electrical power is saved. In addition, since the conductive object detection pattern is disposed on the outermost surface of the optical sensor, it should be made of a material that can effectively transmit light. Such a material may be selected from the group consisting of indium tin oxide, tin oxide and TiOx.

Figure 4:
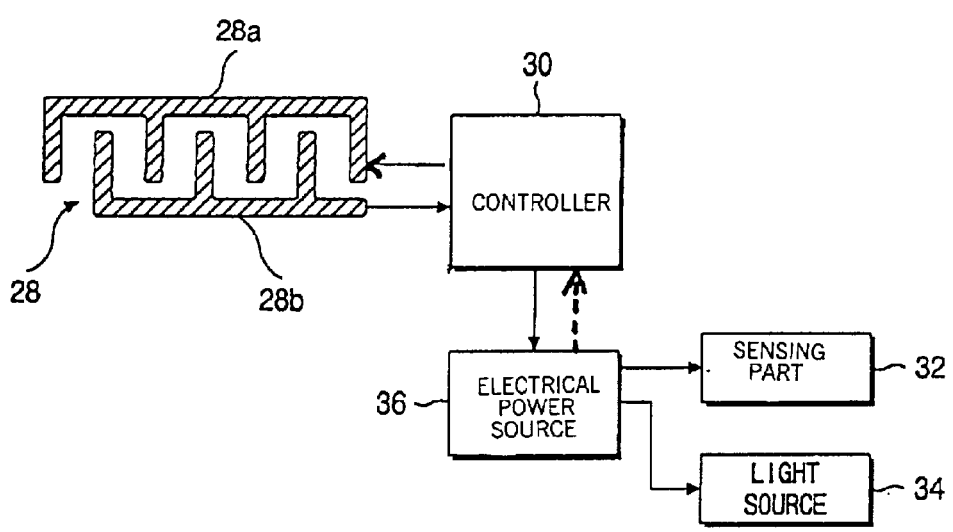
FIG. 4 is a schematic block diagram of a TFT type optical sensor according to a preferred embodiment of the present invention.
Figure 5E:
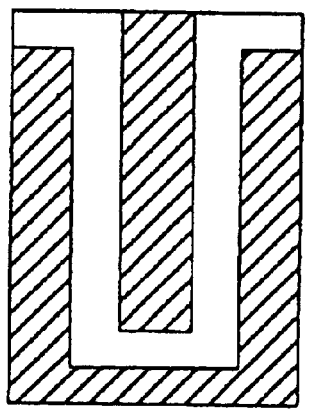
Figure 5F:
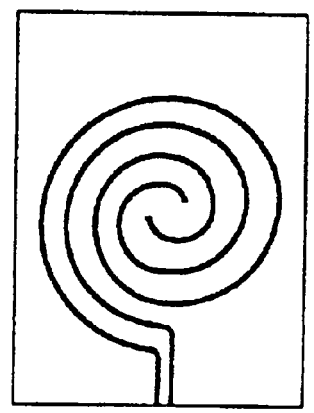

The shape of the conductive object detection pattern can be varied. FIGS. 5a to 5f show various shapes of the conductive object detection pattern FIG. 5a showing a fingershaped pattern which is shown in FIG. 4. In FIG. 5b, the first and second electrodes are parallel, having a P-shaped pattern. In FIG. 5c, the first and second electrodes are linearly disposed having a triangle-shaped pattern. In FIG. 5d, the first and second electrodes are parallel having a rail-shaped pattern. In FIG. 5e, the first electrode is disposed having a U-shaped pattern, and the second electrode is disposed having an I-shaped pattern. In FIG. 5f, the first and second electrodes are parallel, having a coil-shaped or spiral-shaped pattern.

It will be apparent to those skilled in the art that various modifications and variation can be made in the thin film transistor type optical sensor of the present invention without departing from the spirit or scope of the invention. Thus, it is intended that the present invention cover the modifications and variations of this invention, provided they come within the scope of the appended claims and their equivalents.

What is claimed is:

1. An image detector, comprising:
 a conductive object detection pattern, wherein the conductive object detection pattern has a plurality of electrodes, the plurality of electrodes being alternately disposed;
 a light source for illuminating an object on the conductive object detection pattern;
 a sensor for sensing an image of the object;
 a power source selectively supplying power to the light source; and
 a controller detecting a current flowing through the conductive object detection pattern, and in response thereto supplying a control signal to the power source to selectively supply power to the light source.

2. The image detector of claim 1 wherein the plurality of electrodes includes spaced apart first and second electrodes.

3. The image detector of claim 2 wherein the controller transmits a first electrical signal to the first electrode and receives a second electrical signal from the second electrode and detects a conductivity between the first and second electrodes.

4. The image detector of claim 1 wherein the conductive object detection pattern is made of a material selected from a group consisting of indium tin oxide, tin oxide and TiOx.

5. The image detector of claim 1 wherein plurality of electrodes includes spaced apart first and second electrodes, each of the first and second electrodes having a finger-shaped pattern, fingers of the first and second electrodes being alternately disposed.

6. The image detector of claim 1 wherein plurality of electrodes includes spaced apart first and second electrodes, the first and second electrodes being in parallel and having a P-shaped pattern.

7. The image detector of claim 1 wherein the plurality of electrodes includes spaced apart first and second electrodes, the first electrode having a P-shaped pattern and the second electrode being disposed adjacent the first electrode.

8. The image detector of claim 1 wherein the plurality of electrodes includes a triangle-shaped pattern, a part of said triangle-shaped pattern being cut so as to form first and second electrodes.

9. The image detector of claim 1 wherein the plurality of electrodes includes spaced apart first and second electrodes, the first and second electrodes being disposed in parallel so as to form a rail-shaped pattern.

10. The image detector of claim 1 wherein the plurality of electrodes includes spaced apart first and second electrodes, the first electrode having a U-shaped pattern and the second electrode having an I-shaped pattern.

11. The image detector of claim 1 wherein the plurality of electrodes includes spaced apart first and second electrodes, the first and second each having a coil-shape pattern.

12. The image detector of claim 1 wherein plurality of electrodes includes spaced apart first and second electrodes, the first electrode having spiral-shaped pattern and the second electrode being disposed adjacent to the first electrode.

13. The image detector of claim 1 wherein the controller supplies the control signal to the power source to supply power to the light source in response to a living object residing on the conductive object detection pattern.

14. The image detector of claim 1, wherein the controller receives an electrical source for providing the current flowing through the conductive object detection pattern.

15. The image detector of claim 1, wherein the sensor is a thin film transistor optical sensor.

16. The image detector of claim 15, wherein the plurality of electrodes includes spaced apart first and second electrodes.

17. The image detector of claim 16, wherein the controller transmits a first electrical signal to the first electrode and receives a second electrical signal from the second electrode and detects a conductivity between the first and second electrodes.

* * * * *